United States Patent [19]
Ho

[11] Patent Number: 5,947,571
[45] Date of Patent: Sep. 7, 1999

[54] DEVICE ADAPTED TO POSITION INTERFACE CARDS

[76] Inventor: Hsin Chien Ho, 20F-1, No. 268, Wen-Hua Rd., Pan Chiao City Taipei Hsien, Taiwan

[21] Appl. No.: 09/003,150

[22] Filed: Jan. 6, 1998

[51] Int. Cl.⁶ ..................................... A47B 47/00
[52] U.S. Cl. ..................... 312/265.6; 312/223.2; 361/686; 361/801; 361/825
[58] Field of Search ............. 312/265.6, 223.1; 361/825, 801, 683, 686, 726, 740, 747, 759; 439/135

[56] References Cited

U.S. PATENT DOCUMENTS

| | | | |
|---|---|---|---|
| 4,840,568 | 6/1989 | Burroughs et al. | 361/801 X |
| 4,971,563 | 11/1990 | Wells, III | 361/683 X |
| 5,011,418 | 4/1991 | Perzentka, Jr. | 361/683 X |
| 5,235,493 | 8/1993 | Yu | 312/223.2 X |
| 5,575,546 | 11/1996 | Radloff | 312/223.1 X |
| 5,579,210 | 11/1996 | Ruhland et al. | 361/801 X |
| 5,601,349 | 2/1997 | Holt | 312/265.6 |
| 5,640,309 | 6/1997 | Carney et al. | 361/801 |
| 5,673,175 | 9/1997 | Carney et al. | 361/686 |
| 5,684,674 | 11/1997 | Yin | 361/695 |
| 5,694,291 | 12/1997 | Feightner | 361/825 X |
| 5,757,618 | 5/1998 | Lee | 361/825 X |
| 5,831,821 | 11/1998 | Scholder et al. | 361/686 |

*Primary Examiner*—Peter M. Cuomo
*Assistant Examiner*—Hanh V. Tran
*Attorney, Agent, or Firm*—Dougherty & Troxell

[57] ABSTRACT

A device adapted to quickly position interface card seats including a positioning plate and an interface card case. The positioning plate includes a horizontal portion and a vertical portion, which matches a fastening hook at a lower end of the interface card case. When interface card seats containing cards such as VGA cards, network cards, IDE cards, sound cards, etc., are placed into the interface card case, they are pressed by the positioning plate which urge against the front sides and the sides of the interface card seats to quickly position them.

3 Claims, 4 Drawing Sheets

DEVICE ADAPTED TO POSITION INTERFACE CARDS

BACKGROUND OF THE INVENTION (a) Field of the Invention

The present invention relates to a device adapted to position interface cards in a quick and convenient manner.

(b) Description of the Prior Art

Personal computers are generally equipped with slots for possible expansion of the accessories thereof. Functional parts or circuit boards are generally designed to be in the form of cards, such as expansion cards and interface cards, so that they can be coupled to the computer in a very convenient way.

In conventional personal computers, the design of expandable and replaceable cards is to utilize a metal interface card seat. One side of the card seat supports a circuit board to allow insertion of a card. The other side of the card seat may be provided with a terminal so that the card seat may be secured to an interface card case of the computer housing by using screws passing through side holes. In this way, computer accessories may be expandable and coupled to peripheral equipment of the computer main frame. The way to do this is to secure each interface card seat using screws. It is not possible to mount all the interface card seats at one time. Besides, the interface card case cannot be arranged at a corner of one side of the computer housing since this will hinder the use of screwdrivers.

SUMMARY OF THE INVENTION

Accordingly, a primary object of the present invention is to provide a device adapted to quickly position interface card seats. A positioning plate bent through about 90 degrees is utilized to cooperate with hook means at a lower end of the interface card case so that cards such as VGA cards, network cards, IDE cards, sound cards, etc., can be pressed by the positioning plate when being inserted into the interface card case so that they can urge against the sides and front side of the card seat to be quickly positioned in place. If desired, screws may be driven in a vertical direction to reinforce the positioning effect.

BRIEF DESCRIPTION OF THE DRAWINGS

The foregoing and other features and advantages of the present invention will be more clearly understood from the following detailed description and the accompanying drawings, in which.

DETAILED DESCRIPTION OF THE PREFERRED EMBODIMENT

Figure 1:
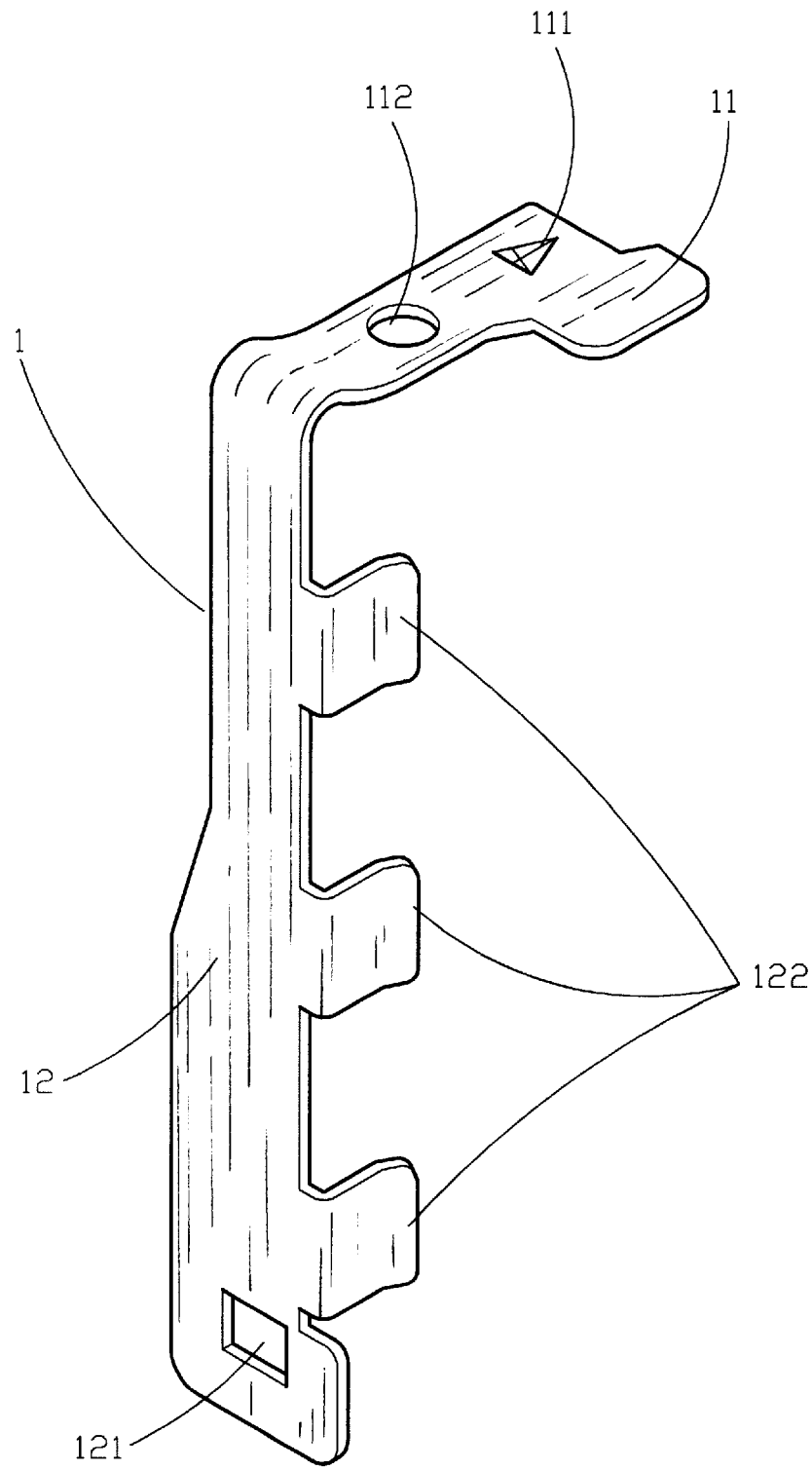
FIG. 1 is a perspective view of the present invention.
Figure 2:
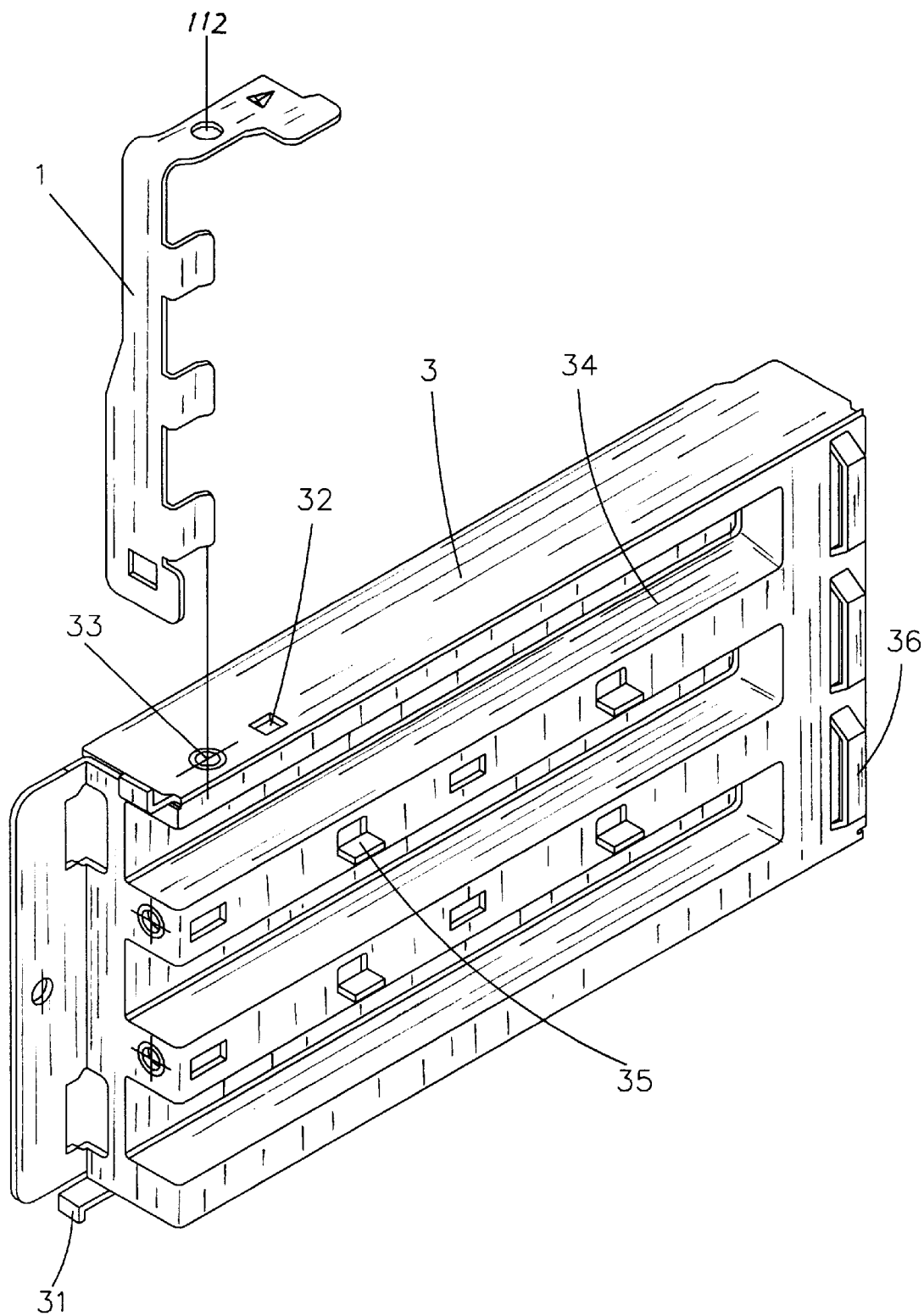
FIG. 2 is a perspective view of the interface card case and the positioning plate of the present invention.
Figure 4:
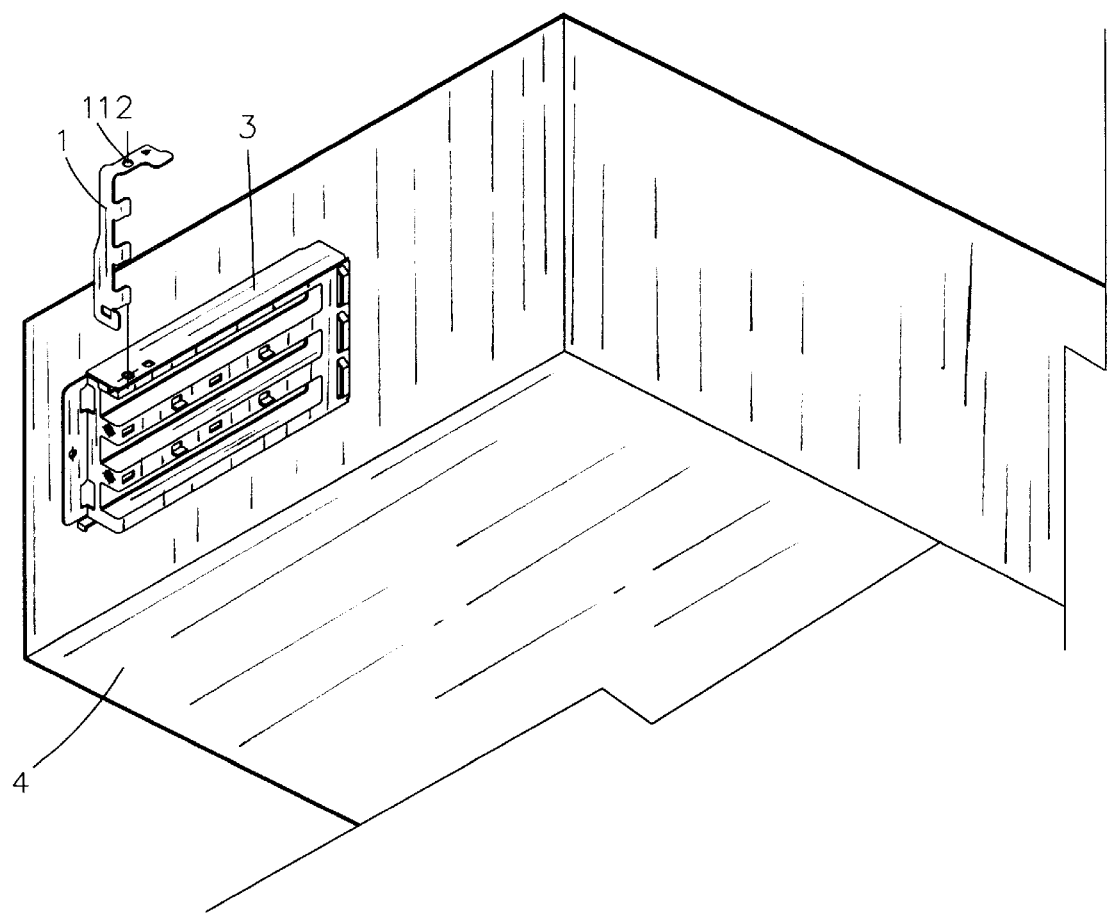
FIG. 4 is a schematic perspective view of the interface card case mounted at one side of the computer housing.

With reference to FIGS. 1 and 2, the present invention essentially comprises an interface card seat positioning plate 1 and an interface card case 3 secured at a vertical side of the back side of a computer housing (see FIG. 4) 4. The positioning plate 1 has a horizontal portion 11 and a vertical portion 12 bent through about 90 degrees. The horizontal portion 11 has a projection 111 projecting downwardly therefrom and a through hole 112. The vertical portion 12 is provided with a hook slot 121 near its lower end and a plurality of supporting tongues 122 bent from an inner rim thereof. As for the interface card case 3, it is substantially the same as the conventional cases. The only difference is that the interface card case 3 of the present invention has a fastening hook 31 oriented outwardly near its lower end as well as a hook slot 32 and a threaded hole 33 at a horizontal side thereof for matching the projection 111 and through hole 112 of the positioning plate 1. The interface card case 3 of the present invention further has retaining pieces 35 provided at a lower rim of its through groove 34.

Figure 3:
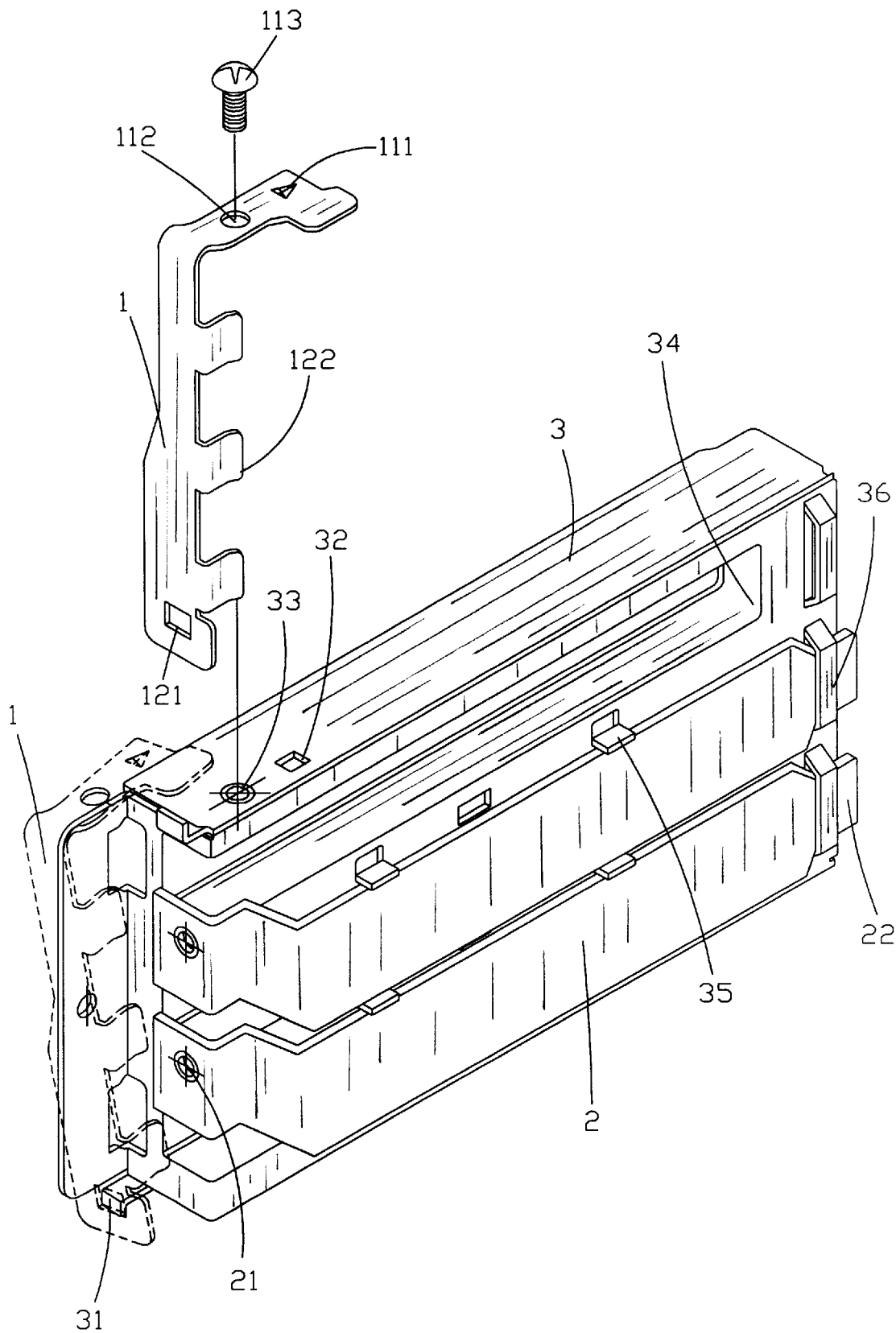
FIG. 3 is a schematic perspective view illustrating the positioning plate after the interface card seat has been placed into the interface card case.

With reference to FIG. 3, in use, the interface card seat 2 positioning is placed into a sleeve seat 36 of the interface card case 3 using its tail end 22. (As the bottom rims of the interface card seats 2 urge against the retaining pieces 35, the card seats 2 will not drop.) The hook slot 121 of the positioning plate 1 receives the fastening hook 31 of the interface card case 3. The positioning plate 1 is then pushed in the direction of the horizontal side of the interface card case 3 until the projection 111 engages the hook slot 32 of the interface card case 3, such that the vertical portion 12 urges against the sides of the interface card seats 2 while the tongues 122 urging against the front sides of the interface card seats 2, thus securing each interface card seats 2 very quickly. If desired, screws 113 may be used to pass through the through hole 112 in a vertical direction into the threaded hole 33 to reinforce the connection.

Although the present invention has been illustrated and described with reference to the preferred embodiment thereof, it should be understood that it is in no way limited to the details of such embodiment but is capable of numerous modifications within the scope of the appended claims.

What is claimed is:

1. A device for quickly positioning interface card seats, each card seat having a tail end portion, the device comprising:
   a) a positioning plate having: a first portion and a second portion extending substantially perpendicularly from the first portion; a projection extending from the first portion; a hook slot through the second portion; and a plurality of support tongues extending from the second portion; and
   b) an interface card case configured to be attached to a wall of a computer housing having: a plurality of through grooves having first and second ends and opposite sides; at least one retaining piece extending from the interface card case adjacent to a side of at least one of the plurality of through grooves; a sleeve seat located adjacent to the first end of each of the plurality of through grooves, the sleeve seats adapted to receive the tail end portions of the card seats; a fastening hook extending from the interface card case engaging the hook slot of the positioning plate; and a slot formed in the interface card case and engaged with the projection from the positioning plate to attach the positioning plate to the interface card case adjacent to the second ends of the plurality of through grooves such that the support tongues bear against the interface card seats to hold the card seats in the interface card case.

2. The device for quickly positioning interface card seats of claim 1 further comprising: a first hole through the first portion of the positioning plate; a second, threaded hole in the interface card case; and a threaded fastener extending into the first and second holes.

3. The device for quickly positioning interface card seats of claim 1 wherein the number of support tongues on the positioning plate is equal to the number of through grooves in the interface card case.

* * * * *